United States Patent [19]
Lam et al.

[11] Patent Number: 5,185,294
[45] Date of Patent: Feb. 9, 1993

[54] BORON OUT-DIFFUSED SURFACE STRAP PROCESS

[75] Inventors: Chung H. Lam, Williston; Jerome B. Lasky, Essex Junction; Craig M. Hill, Burlington; James S. Nakos, Essex; Steven J. Holmes, Burlington; Stephen F. Geissler, Underhill; David K. Lord, Colchester, all of Vt.

[73] Assignee: International Business Machines Corporation, Armonk, N.Y.

[21] Appl. No.: 797,506

[22] Filed: Nov. 22, 1991

[51] Int. Cl.$^5$ .............................. H01L 21/44
[52] U.S. Cl. .................... 437/193; 437/156; 437/190; 437/200
[58] Field of Search ............ 437/51, 156, 190, 192, 437/193, 195, 200, 986; 156/625

[56] References Cited

U.S. PATENT DOCUMENTS

| | | | |
|---|---|---|---|
| 4,502,894 | 3/1985 | Seto et al. | 437/156 |
| 4,654,121 | 3/1987 | Miller et al. | 437/156 |
| 4,745,081 | 5/1988 | Beyer et al. | 437/38 |
| 4,745,087 | 5/1988 | Iranmanesh | 437/193 |
| 4,746,219 | 5/1988 | Holloway et al. | 437/200 |
| 4,782,036 | 11/1988 | Becker et al. | 437/164 |
| 4,873,205 | 10/1989 | Critchlow et al. | 437/200 |
| 4,939,104 | 7/1990 | Pollack et al. | 437/162 |
| 4,983,544 | 1/1991 | Lu et al. | 437/200 |

FOREIGN PATENT DOCUMENTS 62-122124 6/1987 Japan.

OTHER PUBLICATIONS

K. W. Choi and J. E. Cronin, IBM Technical Disclosure Bulletin, vol. 29, No. 3, pp. 1037–1038 (Aug. 1986).
B. Machesney and R. L. Mohler, IBM Technical Disclosure Bulletin, vol. 29, No. 3, pp. 1421–1422 (Aug. 1986).
D. M. Kenney, IBM Technical Disclosure Bulletin, vol. 29, No. 8, p. 3423 (Jan. 1987).
D. W. Plass, IBM Technical Disclosure Bulletin, vol. 32, No. 9A, p. 433 (Feb. 1990).

*Primary Examiner*—Brian E. Hearn
*Assistant Examiner*—C. Chaudhari
*Attorney, Agent, or Firm*—Heslin & Rothenberg

[57] ABSTRACT

The invention provides a method for electrically connecting a polysilicon-filled trench to a diffusion region in a semiconductor device, wherein the trench and diffusion region are separated by a dielectric. The method provides for formation of a strap or bridge contact by utilizing a diffusion barrier layer which prevents diffusion into an overlying polysilicon layer when a subsequent boron out-diffusion step is performed. Selective etching is then utilized to remove the polysilicon layer where no boron has diffused, leaving a polysilicon strap connecting the trench and diffusion region.

22 Claims, 5 Drawing Sheets

BORON OUT-DIFFUSED SURFACE STRAP PROCESS

TECHNICAL FIELD

This invention relates to strap formation in a semiconductor device, and more particularly to electrical connection of a first silicon region to a second silicon region when the two regions are separated by a dielectric. Straps (electrical connections) and methods for their formation are provided.

BACKGROUND ART

Semiconductor devices typically have large numbers of conductive structures which need to be interconnected. Such conductive structures include, for example, silicon regions separated by a dielectric region. The conductive structures are interconnected by forming a "bridge contact" or "strap" between the structures.

Refractory metals and refractory metal silicides have often been used for interconnecting conductive structures. These materials possess low resistivity characteristics normally associated with metals such as aluminum and copper, without providing the manufacturing challenges inherent in these materials (heat sensitivity in the case of aluminum, patterning difficulties in the case of copper). Typically, silicide electrodes are formed on silicon diffusion regions by depositing the refractory metal layer on the substrate, heating the metal to form silicide regions over the exposed silicon regions, and treating the substrate in a wet etchant to remove the unreacted refractory metal.

This silicide forming method poses problems in that the method may consume up to several microns of the underlaying silicon in forming the silicide. This consumption has the effect of greatly reducing the effective dopant concentrations at the silicide/diffusion interface, which can have negative effects on the characteristics of the semiconductor device.

Several solutions have been suggested to remedy this problem. One method is to co-deposit the refractory metal with silicon, such that upon annealing a lesser amount of the junction silicon will be consumed. See U.S. Pat. No. 4,663,191, issued May 5, 1987 to Choi et al. Another technique is to provide additional silicon on top of the junction regions, which will be consumed instead of the underlying silicon. See IBM Technical Disclosure Bulletin, Vol. 20, No. 9, pages 3480-3483 (February 1978).

Others have approached the need for interconnecting conductive structures by utilizing other types of materials, as opposed to refractory metals and refractory metal silicides. For example, the article entitled "Diffusion Defined Bridge Contact" (IBM Technical Disclosure Bulletin, Vol. 29, No. 8, page 3423 [January 1987]) discloses the general concept of employing dopant out-diffusion to define a surface contact between a polysilicon region and a silicon region over a dielectric.

The following references disclose the formation of silicide bridge contacts for connecting a polysilicon-filled trench to a source/drain region over a dielectric: U.S. Pat. No. 4,873,205 (issued Oct. 10, 1989); U.S. Pat. No. 4,983,544 (issued Jan. 8, 1991); "CMOS Process For Titanium Salicide Bridging Of A Trench and Simultaneously Allowing For True Gate Isolation", IBM Technical Disclosure Bulletin, Vol. 29, No. 3 (Aug. 1986), pp. 1037-1038; "Self-Aligned Electrical Connection To Trench", IBM Technical Disclosure Bulletin, Vol. 29, No. 3 (August 1986), pp. 1421-1422; "Multi-Purpose Trench for Complementary Metal Oxide Silicon, Six-Device Static Random-Access Memory Cell", IBM Technical Disclosure Bulletin, Vol. 32, No. 9A (February 1990), p. 433; and U.S. Pat. No. 4,745,081 (issued May 17, 1988). None of the references in this group, however, employs a dopant out-diffusion technique.

In the following group of references, a dopant out-diffusion process was used in the formation of structures other than straps or bridge contacts:

U.S. Pat. No. 4,502,894 (issued Mar, 5, 1985) discloses a process for producing polysilicon resistors, by employing boron out-diffusion. After forming oxide regions, boron or other dopant is implanted into the oxide. A layer of polysilicon is then deposited and patterned, and the structure is treated to cause boron to out-diffuse into the polysilicon.

Japanese Pat. No. 62-122124 (issued Jun. 3, 1987) discloses a process for out-diffusion of boron into an overlying polysilicon layer. After a silicon dioxide film is grown onto a silicon substrate a boron phosphorus silicate glass (BPSG) film is deposited. A contact hole is then formed in the BPSG and the oxide layers, followed by deposition of a polysilicon layer. The structure is then heated to effect boron out-diffusion from the BPSG layer into the polysilicon layer.

U.S. Pat. No. 4,654,121 (issued Mar. 31, 1987) discloses a process for forming stacked CMOS devices. After forming the lower device, an undoped oxide layer and then a doped oxide layer are formed. A planarizing step is then carried out to expose the gate electrode and to form doped oxide regions to the sides of the gate. An upper gate oxide is grown and a polysilicon layer defined over the oxide. The source and drain regions for the upper device are then formed by boron out-diffusion from the lower doped oxide regions.

U.S. Pat. No. 4,782,036 (issued Nov. 1, 1988) discloses a process for doping the sidewalls and base of a trench. After the trench formation in a silicon substrate, a borosilicate glass layer is deposited by decomposition of TEOS and trimethylborate. Then, the structure is treated to cause boron to diffuse into the sidewalls and base, followed by removal of the glass layer.

Despite these approaches to strap formation, a need continues to exist for methods for forming a low resistance connection between conductive structures which can readily be utilized in the fabrication of semiconductor devices at minimal manufacturing expense.

DISCLOSURE OF INVENTION

It is thus an object of the invention to provide a method of producing a strap or connecting bridge for use in the semiconductor industry. The strap is electrically conductive and connects conductive structures within the semiconductor device.

It is a further object of the invention to provide such a method to interconnect two silicon regions separated by a dielectric, such as a polysilicon-filled trench and a diffusion region.

It is another object of the invention to provide such a method wherein the strap or connecting bridge is individually insulated.

It is also an object of the invention to provide straps formed by the methods disclosed herein.

In furtherance of these objectives, the present invention is directed to a process for forming a contact between a polysilicon-filled trench and an adjacent diffusion region, separated by a dielectric. The process involves performing a shallow boron implant, and then depositing a diffusion barrier layer (generally, silicon nitride or aluminum oxide). Next, the barrier layer is patterned to form openings where the contacts are to be formed. Then, a layer of intrinsic polysilicon is deposited using low pressure chemical vapor deposition (LPCVD) over the substrate, i.e. over the barrier layer and in the contact openings. Following that, as a critical step, an anneal is carried out to diffuse boron into the polysilicon. Then, the "lightly doped" portions of the polysilicon are removed with a wet etchant so as to form the desired polysilicon contacts. The remaining polysilicon is then oxidized, to protect the polysilicon from silicide formation during subsequent processing.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1:
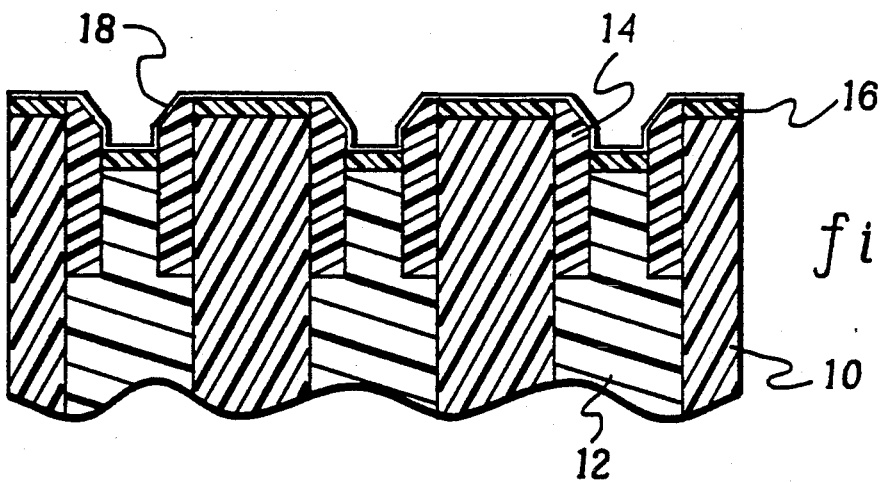
FIG. 1 is a cross sectional view of a polysilicon-filled trench separated from a p+ diffusion region by silicon dioxide. Boron has been implanted into the exposed surface of the trench and the diffusion region, and a layer of silicon nitride has been deposited upon all exposed surfaces.

As used in the subject application, doping refers to the addition of impurities to a semiconductor material. Doping allows the manufacture of n-type and p-type semiconductors with varying degrees of conductivity. In general, the greater the extent of doping, the higher the conductivity.

An n-type material refers to a semiconductor material that has been doped with a donor-type impurity and, consequently, conducts a current via electrons. A p-type material refers to a semiconductor material that has been doped with an acceptor-type impurity and, consequently, conducts a current via hole migration.

Etching refers to chemically eating away a metal to form a desired pattern as an etched circuit, an etched circuit referring to a circuit produced by etching the conductive coating of a substrate to provide the required pattern of conductors and terminals to which discrete components are connected. Selectively etching refers to the use of etching, for example, in the manufacture of circuits, to remove selected portions of one material from another in a semiconductor structure.

A capacitor refers to a passive electronic circuit component consisting of, in basic form, two conductive electrodes or plates separated by a dielectric (or insulator). A trench capacitor refers to a capacitor formed in a trench in the surface of a semiconductor substrate. A stacked capacitor refers to a capacitor formed by stacking the capacitor above the semiconductor substrate.

RIE refers to reactive ion etching. Passivation refers to the process of growing a thin oxide film on the surface of a planar semiconductor device to protect the exposed junction(s) from contamination and shorts, with sidewall passivation referring to this process in relation to sidewalls.

CVD refers to chemical vapor deposition, with chemical deposition being the coating of a surface with a substance resulting from chemical reaction on the surface. LPCVD refers to low pressure chemical vapor deposition. Ion implantation refers to the implantation of ions, for example, for doping a semiconductor substrate.

Silicon, as used in this application, includes polysilicon (polycrystalline silicon), amorphous silicon (noncrystalline silicon), and monocrystalline silicon. Such silicon may be n- or p-doped, or undoped.

As mentioned previously, the broad concept of the subject invention is directed to a method for electrically connecting a first silicon area to a second silicon area when the first and second silicon areas are separated by a dielectric. The first and second silicon areas each have an exposed surface, as well as the dielectric. The method comprises the steps of:

(a) doping the exposed surfaces of the first and second silicon areas;

(b) depositing a continuous diffusion barrier layer over the surfaces of the first and second silicon areas, as well as over the surface of the dielectric;

(c) etching the diffusion barrier layer so as to selectively remove portions of the diffusion barrier layer and thereby expose underlying surfaces;

(d) depositing a continuous layer of polysilicon over the diffusion barrier layer and also over the exposed underlying surfaces;

(e) diffusing the dopant from the first and second silicon areas into the continuous layer of polysilicon, wherein unremoved portions of the diffusion barrier layer prevent diffusion of the dopant into the continuous layer of polysilicon overlying the unremoved portions of the diffusion barrier layer;

(f) etching the resulting structure so as to selectively remove the continuous layer of polysilicon containing no diffused dopant, thereby leaving the continuous layer of polysilicon deposited over the exposed underlying surfaces; and (g) etching the then-resulting structure so as to remove any remaining diffusion barrier layer, a remaining portion of the continuous layer of polysilicon forming the electrical connection between the first silicon region and the second silicon region.

In one embodiment, the first silicon area comprises a polysilicon-filled trench and the second silicon area comprises a diffusion region, separated by silicon dioxide. The silicon areas are doped with boron using ion implantation. Alternatively, the dopant can comprise $BF_2$, in which case an annealing step is required to outgas the fluorine.

It is also possible to dope the exposed surfaces of the first and second silicon areas after steps (b) and (c) instead of prior to steps (b) and (c). In either case, the dopant is applied at the location where the strap is to be formed and the dopant is available for diffusion as discussed below.

The continuous diffusion barrier layer in one embodiment comprises silicon nitride, but could also comprise aluminum oxide or silicon dioxide. The diffusion barrier layer is preferably deposited using chemical vapor deposition.

A mask is then applied over the diffusion barrier layer to define a pattern which includes the area where the electrical connection (or strap) will be formed. The unmasked portions of the diffusion barrier layer are then etched, for example, using reactive ion etching. A continuous layer of polysilicon is then deposited over the remaining diffusion barrier layer and also over the underlying surfaces exposed by the removal of portions of the diffusion barrier layer. Preferably, this deposition comprises chemical vapor deposition.

A critical step in the disclosed method is the diffusion of the dopant from the first and second silicon areas into the continuous layer of polysilicon. The dopant will not diffuse through the remaining diffusion barrier layer, therefore the dopant will only diffuse into the continuous layer of polysilicon corresponding to the position where the diffusion barrier layer had previously been etched away. Preferably, the diffusion comprises annealing at about 900° C. for about 5 minutes, which results in diffusion of the boron to a distance of about 0.2 microns into the layer of polysilicon.

The resulting structure is then wet etched, such as with potassium hydroxide/isopropyl alcohol (KOH/IPA) or other suitable alcohol, or ethylenediamine, pyrocatechol and water (EPW), so as to remove the portions of the continuous layer of polysilicon into which no dopant diffused. Thus, the only remaining portion of the continuous layer of polysilicon is that portion corresponding to the position where the diffusion barrier layer had previously been etched away. Any remaining diffusion barrier layer is then etched away, preferably using reactive ion etching. The remaining portion of the continuous layer of polysilicon forms the electrical connection (strap) between the first silicon and second silicon areas (or polysilicon-filled trench and diffusion region), which are separated by a dielectric.

It is also possible to oxidize the strap polysilicon prior to removing the remaining diffusion barrier so as to provide each strap with its own insulation.

The invention further provides an electrically conductive strap for connecting a first silicon area and a second silicon area formed by the method discussed above. In one embodiment, the first silicon area in the strap formation comprises a polysilicon-filled trench and the second silicon area comprises a diffusion region. The polysilicon-filled trench and the diffusion region are separated by a dielectric.

More specifically, the invention provides a "Boron out-diffused surface strap" or "BOSS" and a method of forming the strap. The BOSS process as depicted in FIGS. 1–10 is as follows.

As shown in FIG. 1, at the junction between a P+ polysilicon region 10 and a polysilicon-filled trench 12, separated by a dielectric silicon dioxide layer 14, an additional boron ion implantation 16 is performed which raises the near surface concentration well above solid solubility. In one embodiment, 2E15 $BF_2$ at 10 keV was utilized.

After the boron 16 is implanted (but not annealed), a layer of nitride 18 is deposited using low pressure chemical vapor deposition (LPCVD), preferably silicon nitride to a thickness of 250 Å (see FIG. 1).

Figure 2:
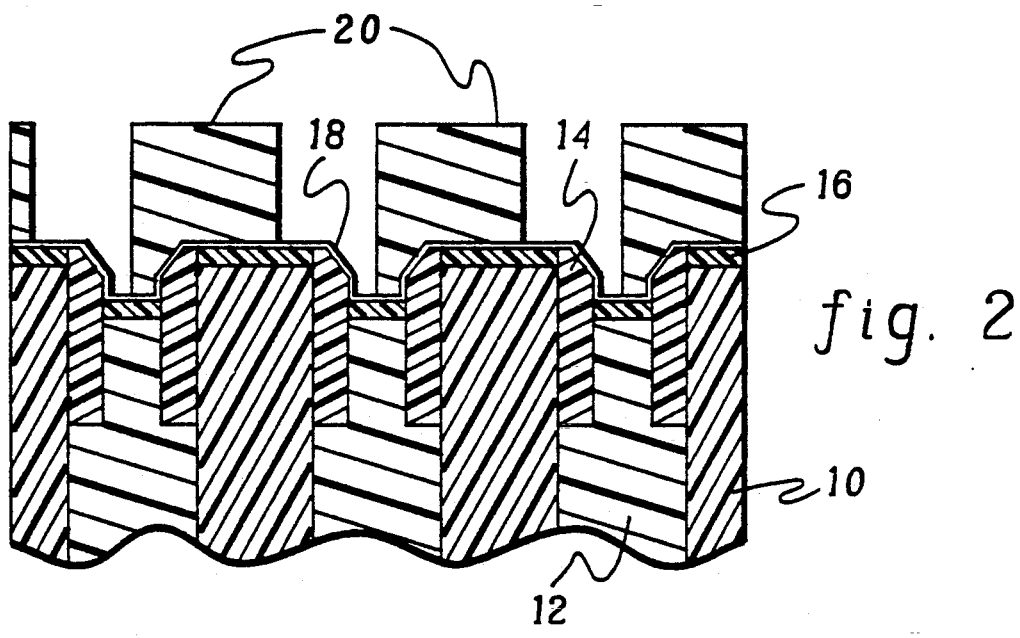
FIG. 2 is a cross sectional view of the structure shown in FIG. 1 with a surface strap mask applied thereto.
Figure 3:
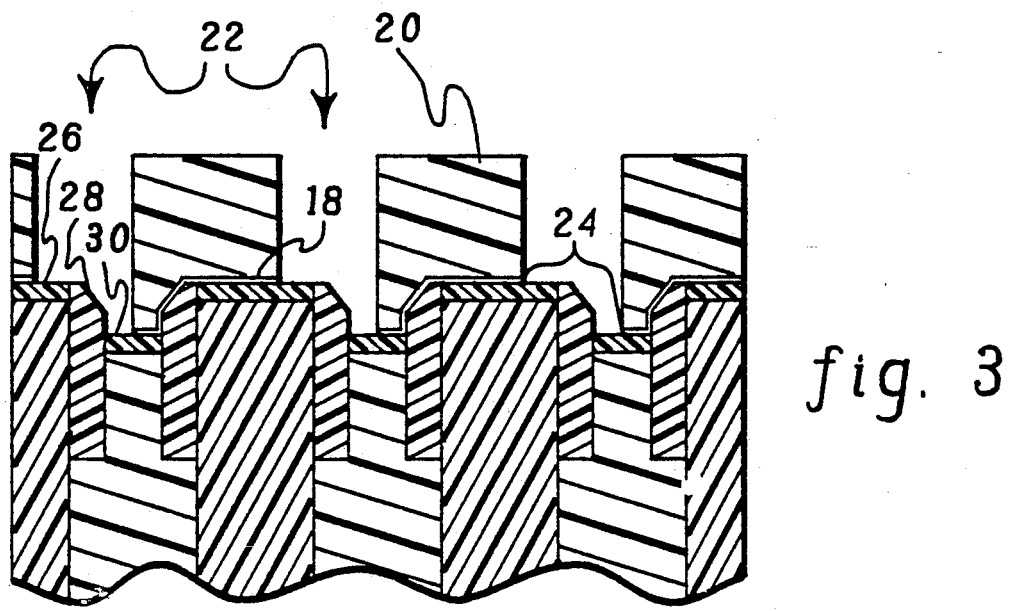
FIG. 3 is a cross sectional view of the structure shown in FIG. 2 after reactive ion etching has removed portions of the silicon nitride.

As shown in FIG. 2, a layer of resist 20 is then applied to serve as a surface strap mask for reactive ion etching of the nitride layer. As shown in FIG. 3, the nitride 18 is etched 22 at area 24 which is where the strap is to go. This area 24 includes the top surface 26 of the p+ region, the top surface 28 of the dielectric, and the top surface 30 of the trench.

Figure 4:
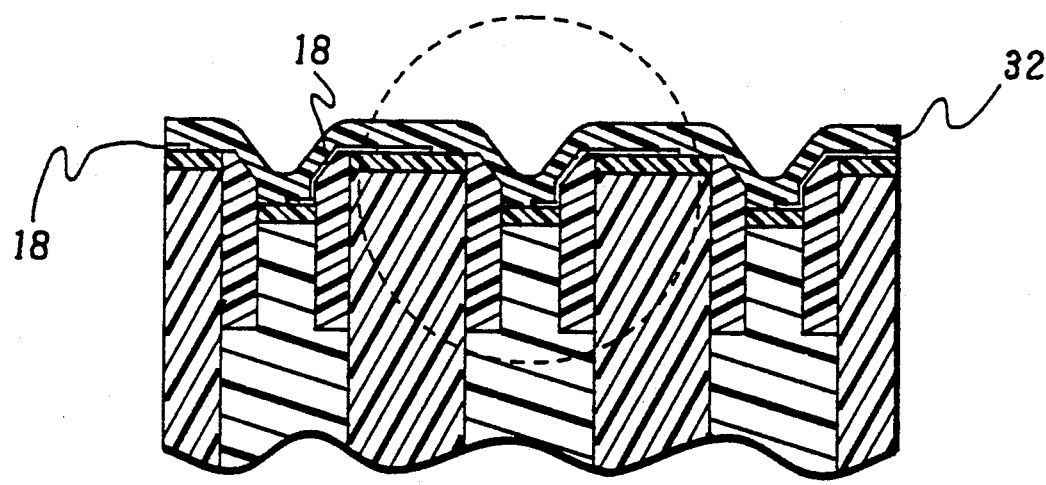
FIG. 4 is a cross sectional view of the structure shown in FIG. 3 after chemical vapor deposition of an intrinsic polysilicon layer.
Figure 5:
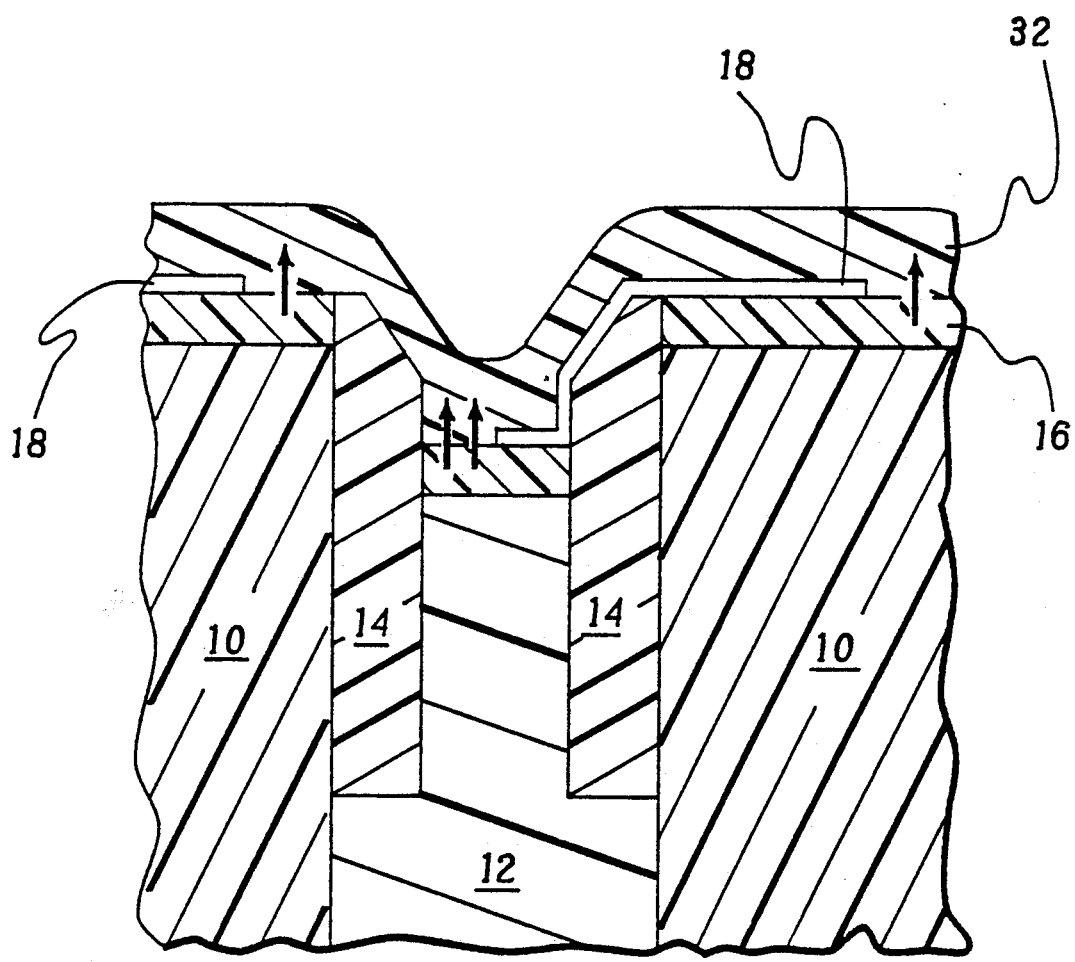
FIG. 5 is an exploded view of the encircled portion of FIG. 4 wherein arrows represent the flow of boron during annealing or out-diffusion.

As shown in FIG. 4, the resist layer is removed and a layer of intrinsic polysilicon 32 is then applied over the entire structure using LPCVD. In one embodiment, the deposited polysilicon is 1200 Å thick. FIG. 5 shows the step of boron out-diffusion (represented by arrows to indicate the diffusion of the boron), or annealing, wherein boron diffuses into the deposited polysilicon to define the strap. In one embodiment, annealing was at 900° C. for 5 minutes.

Figure 6:
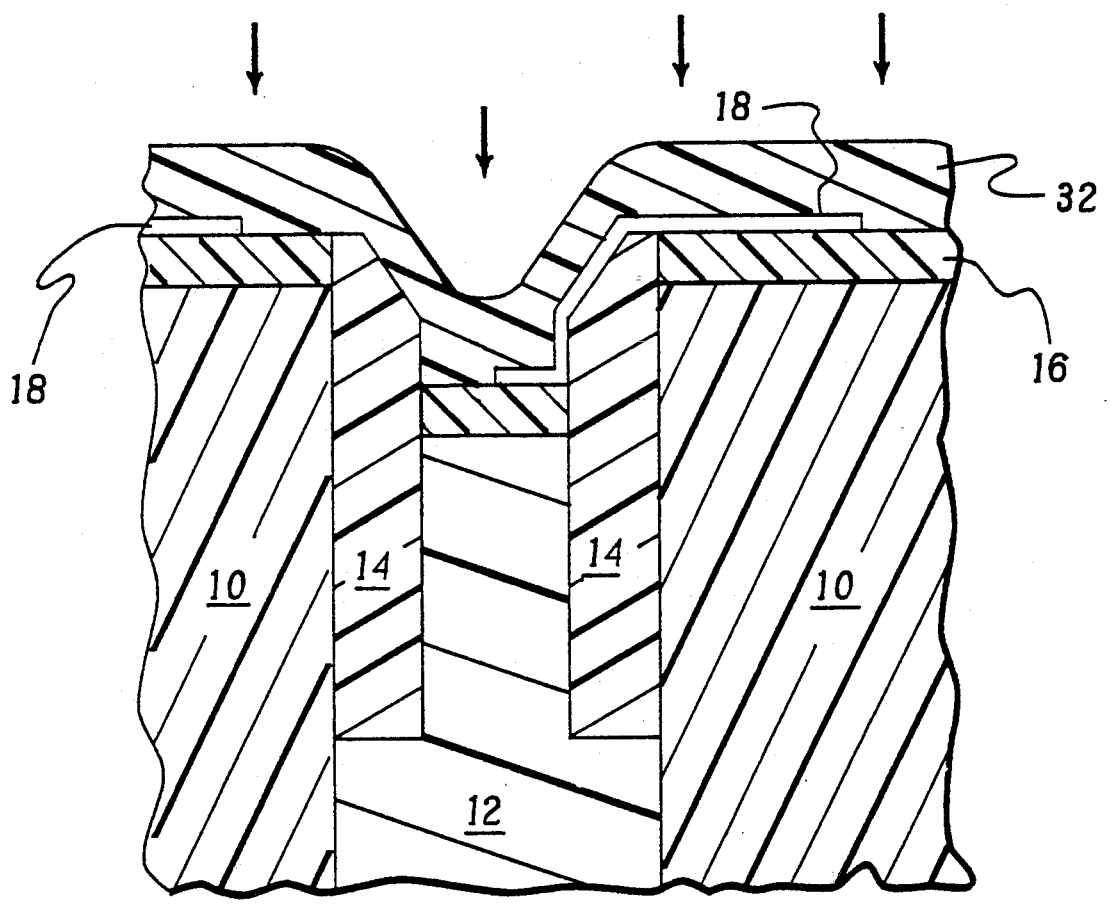
FIG. 6 is a cross sectional view of the structure shown in FIG. 5 wherein arrows represent wet etching with KOH/IPA after diffusion.
Figure 7:
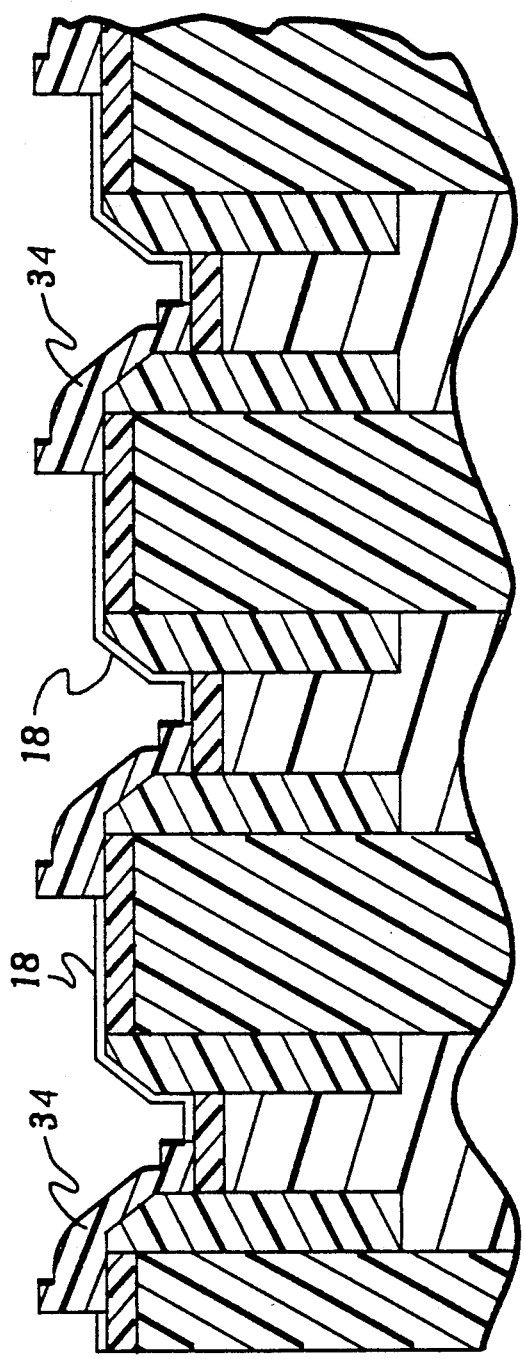
FIG. 7 is a cross sectional view of the structure shown in FIG. 6 after wet etching to form the strap.

FIG. 6 shows the step of wet etching, for example using potassium hydroxide/isopropyl alcohol (KOH/IPA) or other suitable alcohol; or ethylenediamine, pyrocatechol and water (EPW), to remove "lightly doped" polysilicon (the etching represented by arrows). The lightly doped polysilicon is that polysilicon which has not been further doped during the boron out-diffusion step, i.e. that polysilicon deposited over the nitride layer. Thus, the remaining polysilicon corresponds to the area 24 in FIG. 3 and represents the strap 34 as shown in FIG. 7. RIE is then utilized to remove the remaining nitride layer 18 as also shown in FIG. 7.

Figure 8:
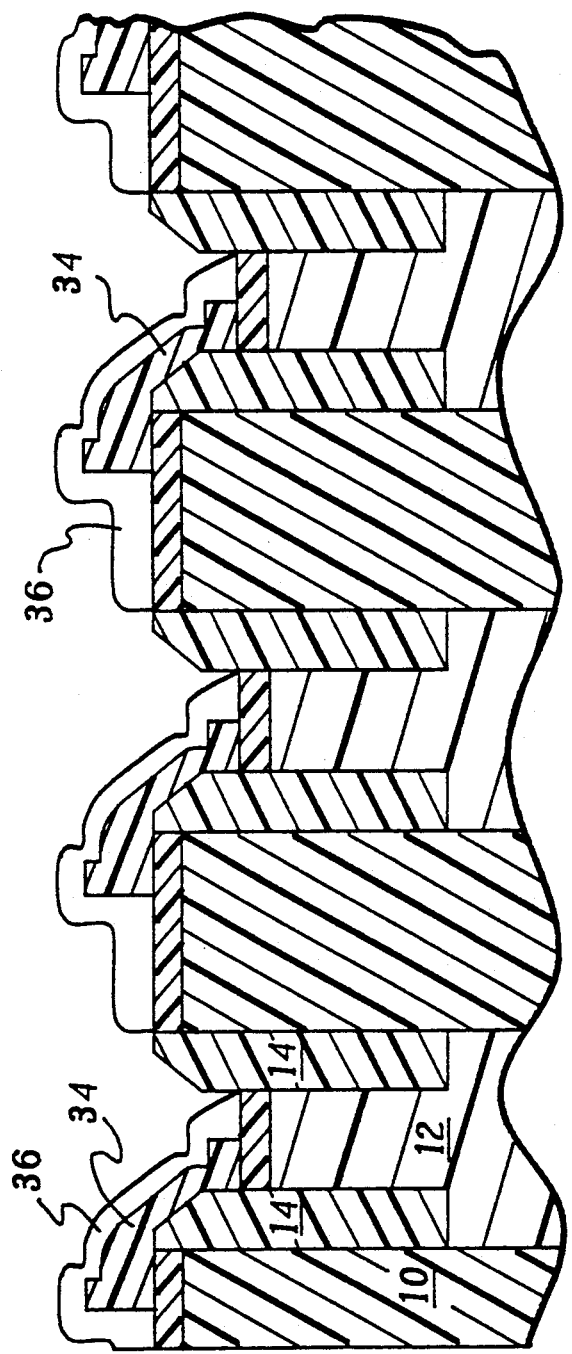
FIG. 8 is a cross sectional view of the structure shown in FIG. 7 after reactive ion etching has removed any remaining silicon nitride, and a layer of titanium silicide has been selectively formed over exposed silicon areas.

After the nitride layer 18 is removed, the strap 34 remains interconnecting the diffusion region 10 and the polysilicon-filled trench 12, separated by a dielectric 14 (see FIG. 8). A layer of titanium silicide 36 can then be applied over remaining silicon and/or polysilicon regions. Specifically, a layer of titanium is deposited over the entire structure and heated to cause reaction between the titanium and any underlying silicon or polysilicon. The resulting titanium silicide allows lower resistance, and the unreacted titanium is removed using any suitable means known to those skilled in the art.

Each of these steps can be optimized to define the process window. Specifically, the purpose of the additional ion implantation at the P+ junction formation is to provide a reservoir of boron which will last throughout the strap diffusion step. Since the standard semiconductor junction already raises the concentration above solid solubility, this additional ion implantation causes no change in the junction depth. For an ion implantation of 1E15 or greater there is no increase in strap length. That is, for doses greater than this, the boron reservoir has not been depleted at the end of diffusion.

If $BF_2$ is used for the high dose ion implantation, a fluorine out-gas anneal is required. Preferred conditions for the fluorine out-gas anneal are 700° C. for 20 minutes, but this can be replaced by a hold in the low pressure nitride deposition after insertion but before putting on the reactant vapors.

The preferred anneal cycle of 900° C. for 5 minutes was chosen to give 0.2 microns of "out-diffused" strap formation. However, diffusing at higher temperatures may result in a more robust strap. Since boron solid solubility increases with temperature, the poly strap will be more highly doped. KOH/IPA etch selectivity is a strong function of doping level. For 1200 Å poly deposited and diffusion at 900° C., the strap thickness is 600-800 Å after a 100% over-etch in KOH/IPA. The strap is expected to be close to 1200 Å after etch for diffusion at higher temperatures (1000° C.).

Straps produced by this methods have been tested. Parameter analysis traces show ohmic straps.

Also, because the boron is out-diffused 0.2 microns, the strap extends only this distance up the side of the gate stack. This is contrasted with the previously known straps which extend up the entire length of the Gate stack. This should decrease the incidence of Gate to node shorts. It will also decrease word line Gate capacitance.

With this process, there is an option of doing a masked TTO, thus expanding the shallow trench isolation oxide thickness process window by about 2000 Å. TTO refers to "trench top open" and refers to removing oxide over the trenches after the whole surface is planarized and the gate conductors are formed. It is important that oxide over the trenches be etched out before masking for the nitride etch, or after the nitride is patterned. In the case of masked TTO, where the oxide over the trench is etched after the nitride is patterned, the boron skin implant is done after the patterned resist for nitride etching is removed (see below).

Taking advantage of the $Si_3N_4$ diffusion barrier layer in the BOSS process, this invention further provides a short oxidation which can be easily integrated into the BOSS process to oxidize the strap polysilicon selectively. Oxidation of the strap polysilicon provides each individual strap with its own insulation, thus isolating the straps from the $TiSi_2$ formation process. Since the straps are individually insulated, shorting to adjacent cells is avoided unless out-diffusion length exceeds half of the linear distance between the edges of two adjacent strap holes. This distance is considerably greater than that without the oxidation. Boron depletion from the strap into $TiSi_2$ is also eliminated since $TiSi_2$ is not formed on the straps.

The insulation step incorporated into the method of the invention can be summarized as follows (for description of these and additional method steps, see above):

1) Boron skin implant (can be done after first RIE etch of nitride at step 4).
2) Deposit 250 Å nitride diffusion barrier.
3) Apply a surface strap mask.
4) RIE etch the nitride.
5) Deposit 1200 Å intrinsic polysilicon.
6) Out-diffusion anneal.
7) Wet etch using KOH/IPA to selectively etch the polysilicon.
8) Perform strap oxidation (this is the insulation step).
9) RIE etch the nitride.
10) $TiSi_2$ formation.

Figures 9, 10:
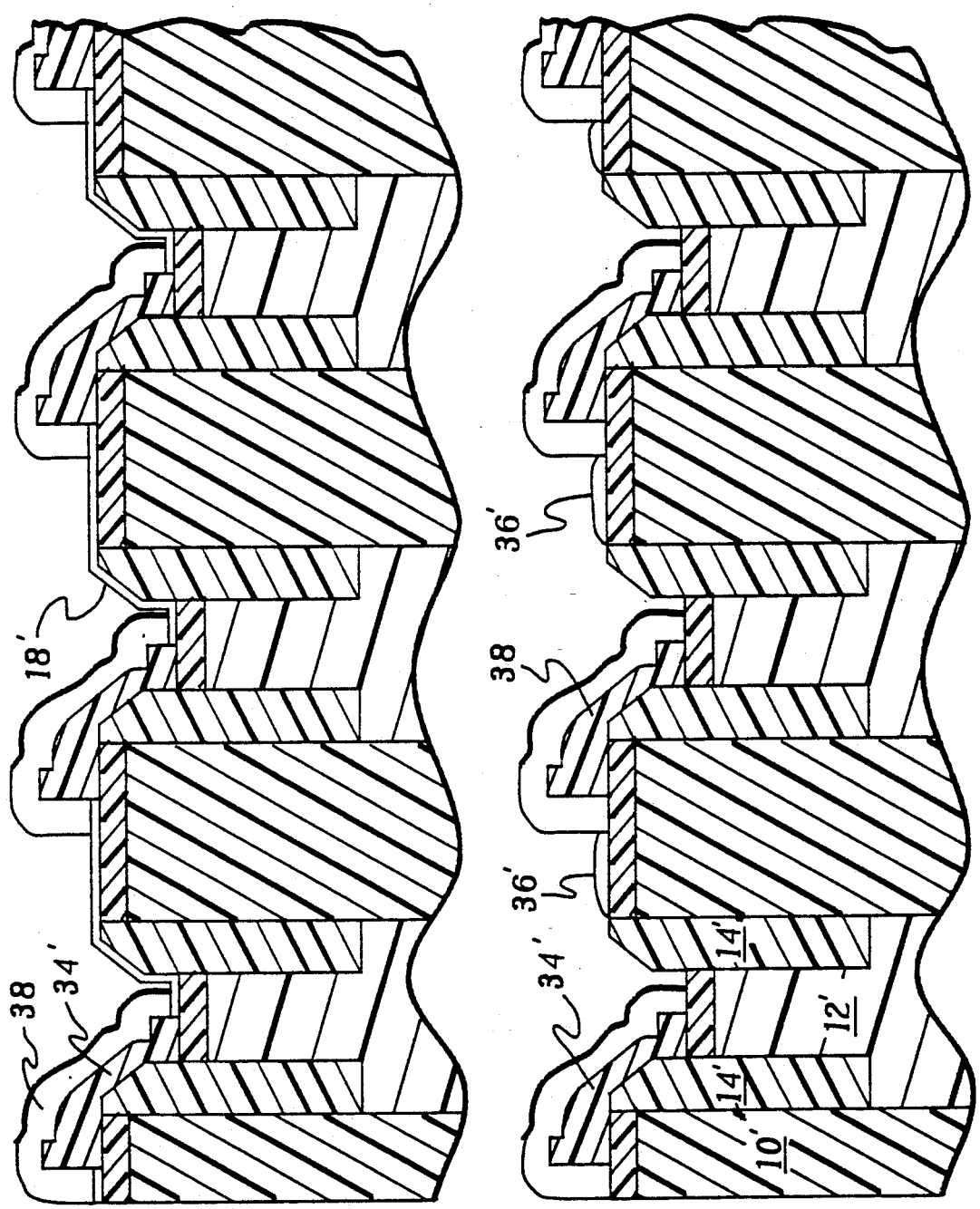
FIG. 9 is a cross sectional view illustrating the optional step of oxidizing the polysilicon strap (shown in FIG. 7) prior to reactive ion etching to remove any remaining silicon nitride.
FIG. 10 is a cross sectional view of the structure shown in FIG. 9 after reactive ion etching has removed any remaining silicon nitride and a layer of titanium silicide has been selectively formed over exposed silicon areas.

This optional oxidation step is depicted in FIG. 9 and FIG. 10. As shown in FIG. 9, before the RIE etch of any remaining nitride 18' as discussed above, a layer of oxide 38 is formed on the strap 34'. The strap oxidation is performed before the removal of the barrier $Si_3N_4$ layer so that oxidation occurs only on the polysilicon straps. FIG. 10 shows the strap 34' with the oxide layer 38 after the remaining nitride layer has been removed, and the titanium silicide layer 36' over the remaining silicon and/or polysilicon regions.

The strap oxidation step is incorporated into the original BOSS process described above. Added heat cycle time due to the oxidation is found to have negligible effect on junction depth. This oxidation step is based on the principle that the amount of out-diffusion required to strap the trench capacitor to the diffusion region is equal to half of the linear distance from the edge of the diffusion region to the edge of the recessed trench.

Without the oxidation step, the maximum allowable out-diffusion is governed by the linear distance measured from the edge of the strap hole to the adjacent diffusion region or trench. While the thin nitride layer provides insulation underneath the polysilicon straps, subsequent $TiSi_2$ formation atop of the strap connecting the diffusion region and the trench would short the strap, at random, to adjacent diffusion region or trench. In addition, depletion of boron due to boron segregation during and after the $TiSi_2$ formation process can result in highly resistive straps with undesirable non-ohmic behavior. Insulation of the straps from $TiSi_2$ alleviates this problem.

While the invention has been particularly shown and described with reference to preferred embodiments thereof, it will be understood by those skilled in the art that various changes in form and details may be made therein without departing from the spirit and scope of the invention.

We claim:

1. A method for electrically connecting a first silicon area to a second silicon area, said first and said second silicon areas each having an exposed surface and being separated by a dielectric, said dielectric also having an exposed surface, which method comprises the steps of:
   (a) doping said exposed surface of said first silicon area and said exposed surface of said second silicon area;
   (b) depositing a continuous diffusion barrier layer over said surface of said first silicon area, said surface of said second silicon area, and said surface of said dielectric;
   (c) etching said diffusion barrier layer so as to selectively remove portions of said diffusion barrier layer and thereby expose underlying surfaces;
   (d) depositing a continuous layer of polysilicon over said diffusion barrier layer and also over said exposed underlying surfaces;
   (e) diffusing said dopant from said first silicon area and said second silicon area into said continuous layer of polysilicon, wherein unremoved portions of said diffusion barrier layer prevent diffusion of said dopant into said continuous layer of polysilicon overlying said unremoved portions of said diffusion barrier layer;
   (f) etching the resulting structure so as to selectively remove said continuous layer of polysilicon containing no diffused dopant, thereby leaving said continuous layer of polysilicon deposited over said exposed underlying surfaces; and (g) etching the then-resulting structure so as to remove any remaining diffusion barrier layer, a remaining portion of said continuous layer of polysilicon forming said electrical connection between said first silicon region and said second silicon region.

2. The method of claim 1 wherein one of said first silicon area and said second silicon area comprises a polysilicon-filled trench.

3. The method of claim 1 wherein one of said first silicon area and said second silicon area comprises a diffusion region.

4. The method of claim 1 wherein said dielectric region comprises silicon dioxide.

5. The method of claim 1 wherein said dopant comprises boron.

6. The method of claim 5 wherein said doping with boron is by ion implantation.

7. The method of claim 1 wherein said dopant comprises $BF_2$.

8. The method of claim 1 wherein said diffusion barrier layer comprises silicon nitride.

9. The method of claim 1 wherein said diffusion barrier layer comprises aluminum oxide.

10. The method of claim 1 wherein said deposition in step (b) comprises chemical vapor deposition.

11. The method of claim 1 wherein said etching in step (c) comprises reactive ion etching.

12. The method of claim 1 wherein said deposition in step (d) comprises chemical vapor deposition.

13. The method of claim 1 wherein said diffusion in step (e) comprises annealing at about 900° C. for about 5 minutes.

14. The method of claim 13 wherein said diffusion into said continuous layer of polysilicon extends about 0.2 microns.

15. The method of claim 1 wherein said etching in step (f) comprises wet etching.

16. The method of claim 15 wherein said wet etching comprises etching with potassium hydroxide/isopropyl alcohol.

17. The method of claim 15 wherein said wet etching comprises etching with ethylenediamine, pyrocatechol, and water.

18. The method of claim 1 wherein said etching in step (g) comprises reactive ion etching.

19. The method of claim 7 further comprising annealing said $BF_2$ with said first and said second silicon regions prior to step (b).

20. The method of claim 1 wherein said continuous layer of polysilicon deposited over said exposed underlying surfaces of step (f) is oxidized prior to said etching in step (g).

21. The method of claim 1 further comprising forming a layer of titanium silicide on any remaining exposed silicon or polysilicon.

22. The method of claim 21 wherein said formation of said layer of titanium silicide comprises:

depositing a layer of titanium on said electrically connected first silicon area and second silicon area;

reacting said deposited layer of titanium with any exposed silicon or polysilicon underlying said deposited layer, so as to form titanium silicide; and removing any unreacted titanium, thereby forming said layer of titanium silicide overlying exposed silicon or polysilicon.

* * * * *